United States Patent [19]

Suzuki

[11] 4,309,680

[45] Jan. 5, 1982

[54] ELECTRO-MECHANICAL FILTER INCLUDING MECHANICAL RESONATOR

[75] Inventor: Koji Suzuki, Kawagoe, Japan

[73] Assignee: Nippon Bearing Company Limited, Ojiya, Japan

[21] Appl. No.: 51,704

[22] Filed: Jun. 25, 1979

[30] Foreign Application Priority Data

Jul. 7, 1978 [JP] Japan .................... 53-93474[U]

[51] Int. Cl.³ .......................................... H01Q 9/50
[52] U.S. Cl. ................................. 333/197; 333/198
[58] Field of Search ............ 333/197, 198, 187, 189

[56] References Cited

U.S. PATENT DOCUMENTS

| | | | |
|---|---|---|---|
| 3,983,516 | 9/1976 | Johnson | 333/197 |
| 4,091,345 | 5/1978 | Yano et al. | 333/187 |
| 4,100,506 | 7/1978 | Ernyei | 333/197 |
| 4,124,829 | 11/1978 | Kuenemund | 333/197 |

*Primary Examiner*—Eli Lieberman

[57] ABSTRACT

An electromechanical filter having mechanical resonators which is used as a channel filter for a mobile radio communication receiver and a carrier telephone. The electromechanical filter is provided with exciter means, each of which is composed of a transducer and an exciter formed as a unitary structure and has the both functions. Each exciter means is a bar-shaped piezoelectric ceramic having a pair of electrodes deposited on its opposing surfaces and subjected to polarization treatment. The exciter means are mechanically coupled by mechanical coupling means with the mechanical resonators.

4 Claims, 8 Drawing Figures

ELECTRO-MECHANICAL FILTER INCLUDING MECHANICAL RESONATOR

BACKGROUND OF THE INVENTION

1. Field of the Invention

This invention relates to an electrical filter, and more particularly to an electromechanical filter provided with a mechanical resonator.

2. Description of the Prior Art

An electromechanical filter is well-known in the field of telecommunication filter and is now used widely in a radio receiver, a carrier telephone equipment, etc. The electromechanical filter is, in principle, made up of an excitation part mainly composed of a mechanical exciter, a resonance part mainly composed of a mechanical resonator and a coupling part for mechanically coupling together the excitation and the resonance part. Especially in an electromechanical filter of 200 to 500 KHz for use as a channel filter is an aeronautical or maritime radio communication receiver, carrier telephone equipment or the like, use is made of a columnar metal rod resonator which utilizes a longitudinal or torsional vibration mode as a dominant mode. The excitation part is generally comprised of a transducer and an exciter; and a typical example of this excitation part is what is called the Langevin structure that an exciter composed of a columnar metal rod is attached to either side of a disc-shaped transducer using an adhesive binder, such as epoxy resin or the like, as set forth in "The Electro-Acoustic Sensitivity of Cylindrical Ceramic Tubes", The Journal of the Acoustic Society of America, No. 3, pp 421, May 1954. Another example of the existing excitation part is a known flexural structure in which a strip-shaped transducer, for example, a peizoelectric ceramic, is attached to one side of an exciter formed with a strip of metal, using epoxy resin or like adhesive binder; however, this flexural structure is susceptible to a bending vibration mode other than the longitudinal vibration mode utilized as the dominant mode and the resulting spurious response extremely degrades the filtering characteristic.

With recent marked enhancement of the characteristics of transducers, including a lead-zirconate-titanate, a transducer of excellent temperature stability is now available. In either of the conventional Langevin type and the flexural structure, however, an organic material of poor temperature stability is employed as an adhesive binder for coupling of the transducer and the exciter, so that the temperature stability of the filter is still low as a whole.

Further, in order to achieve mechanical impedance matching between the mechanical resonator and the exciter, the mass of the latter must be made half that of the former; but, since the conventional excitation part is composed mainly of a metallic exciter of a large density, the excitation part becomes too small, especially in the high-frequency use, introducing difficulty in its fabrication.

SUMMARY OF THE INVENTION

Accordingly, it is one object of this invention to provide an electromechanical filter which is simple and rigid in construction and can be manufactured at low cost.

It is another object of this invention to provide an electromechanical filter which has little spurious response but excellent electrical characteristics.

It is still another object of this invention to provide an electromechanical filter which has excellent temperature stability.

In accordance with this invention which achieves the above and other objects, an electromechanical filter is provided which has an excitation part composed of a transducer and an exciter formed as a unitary structure with each other.

The abovesaid objects can be achieved by providing an electromechanical filter which comprises exciter means composed of one or more transducers for exciting a mechanical vibration, resonator means composed of one or more mechanical resonators for resonating with the exciter means and coupler means composed of one or more mechanical couplers for mechanically coupling the exciter means and the resonator means with each other, the mechanical couplers being disposed to extend across the exciter means and the resonator means substantially at right angles and secured to the both means, and in which the transducers are each formed with a bar-shaped piezoelectric ceramic having a pair of electrodes formed to its opposing surfaces and subjected to polarization treatment.

Briefly stated, in the present invention, the prior art transducer and exciter are formed as a unitary structure, so that the electromechanical filter of this invention is simple in construction, inexpensive and stable mechanically and electrically.

Other objects, features and advantages of this invention will become apparent from the following description taken in conjunction with the accompanying drawings.

DESCRIPTION OF THE PREFERRED EMBODIMENTS

Figure 1:
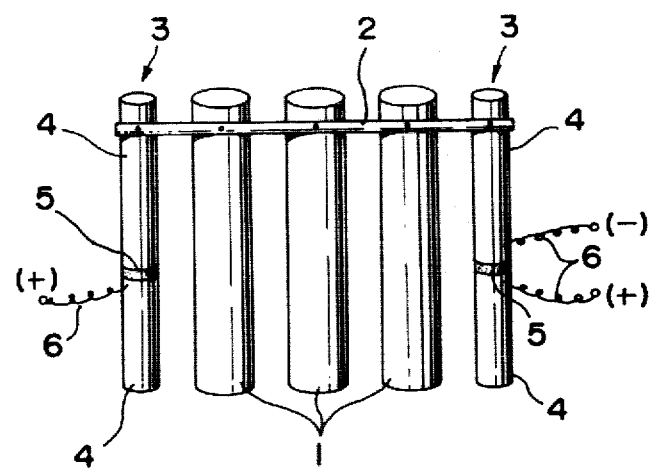
FIG. 1 is a perspective view showing a conventional electromechanical filter employing Langevin type transducer.

In FIG. 1, there is shown a conventional electromechanical filter having Langevin type exciter means 3. The Langevin type exciter means 3 are each composed of a disc-shaped transducer 5, for example, a piezoelectric ceramic, and a cylindrical metal exciter 4 attached to each of top and bottom surfaces of the transducer using epoxy resin or like adhesive binder. Reference numeral 1 indicates cylindrical metal resonators, the three resonators 1 constituting one resonator means. A cylindrical metal coupler 2 is secured by soldering or spot welding to the resonator means and the exciter means disposed on both sides thereof so that the exciter means 3 and the resonator means 1 are coupled together mechanically. Each of the exciters 4 secured to both sides of the piezoelectric ceramic 5 is also used as an electrode for supplying a voltage to the piezoelectric ceramic and connected via a lead 6 to an electrical signal source (not shown). When supplied with an AC signal via the lead 6, the piezoelectric ceramic 5 vibrates in a vertical direction to excite a mechanical vibration in each exciter 4. This mechanical vibration is coupled via the coupler 2 to the resonators 1. The AC signal inputted via the lead 6 to the electromechanical filter is scattered as mechanical vibration energy inside and outside of the electromechanical filter, so that the electrical signal is greatly attenuated; but when the input signal frequency coincides with the resonant vibration frequency of the resonator 1, such attenuation of the input signal does not occur. Consequently, the electromechanical filter shown in FIG. 1 functions as a band-pass filter that has a non-attenuation frequency band of a predetermined width about the resonant vibration frequency of the resonator 1. As the number of such resonators 1 increases, the tuning sensitivity or selectivity of the resonator means increases and the resulting filter has high selectivity. Since the bandwidth is dependent on the ratio of mechanical impedance between the resonator and the coupler, the bandwidth also varies with the number of couplers 2 used; accordingly, the bandwidth can be adjusted by the addition of another coupler 2. The addition of another coupler 2 is also effective for increasing rigidity of the electromechanical filter. In the case of employing the Langevin type exciter means as shown in FIG. 1, however, if the couplers 2 are secured to the upper and lower portions of the exciter means, the electrical signal is short-circuited via the resonators 1 to completely impair the function of the electromechanical filter. Further, as will be appreciated from FIG. 1, the structure employing the Langevin type exciter means is poor in rigidity, and consequently it is difficult to maintain stable electrical characteristics for a long period of time.

Figure 2:
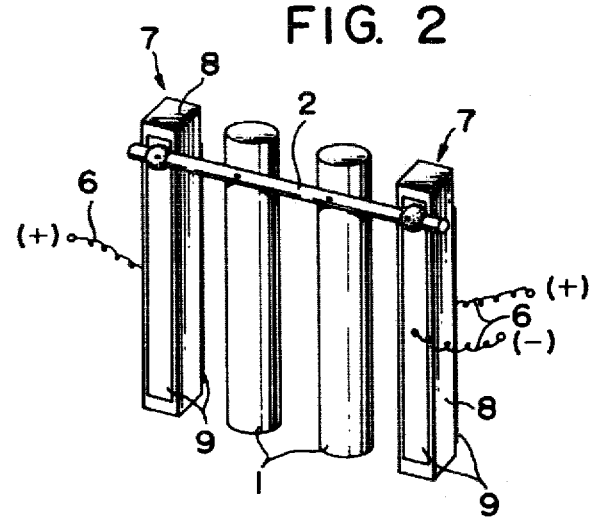
FIG. 2 is a perspective view illustrating an embodiment of this invention.

FIG. 2 illustrates in perspective an embodiment of this invention. The cylindrical metal resonators 1 are made, for example, of an alloy consisting of 42% Ni, 5% Cr, 2% Ti, 0.5% Al, 0.5% Mn and the remainder Fe in weight percentage. The size of each cylindrical metal resonator, though different for each frequency band used, is 0.65 mm. in outer diameter and 8.0 mm. in length in the case of a frequency band of 100 to 500 KHz. The coupler 2 is made of the same material as the resonator 1 and has an outer diameter of 0.2 mm. and a length of 1 mm., for instance. After being machine-worked, the resonators 1 and the coupler 2 are all heat treated prior to assembling. The heat treatment is carried out in vacuum or in argon or like inert gas at 600° to 700° C. for two hours. By this heat treatment, the temperature dependency of frequency of the entire assembly can be made to $\pm 10^{-5}/°C$.

Each piezoelectric transducer 7 functions both as the transducer and the exciter used in the prior art and is composed of a square-rod like piezoelectric ceramic 8 and a pair of metal electrodes 9 formed on one opposing pair of surfaces of the piezoelectric ceramic 8. A preferred example of the material for the piezoelectric ceramics 8 is $PbTiO_3$-$PbZrO_3$-$Pb(Cd.Nb)O_3$ but may also be $PbTiO_3$-$PbZrO_3$-$Pb(Sb.Nb)O_3$ The piezoelectric ceramic 8, for example, in the case of a filter for a 300 KHz band, is 0.7 mm. wide, 0.4 mm. thick and 5.7 mm. long. The silver electrodes (usually, metal electrodes) 9, about 0.01 mm. thick, are formed by vacuum deposition or printing (at 700° C. for 20 minutes) on one pair of opposing surfaces of the piezoelectric ceramic 8 and then subjected to polarization treatment. The metal electrodes 9 may also be formed by chemical plating of gold, copper, solder or the like to a thickness of 1 to 5 $\mu$m. The polarization treatment is achieved by applying between electrodes an electric field of about 3 KV/mm for 20 minutes or so in a silicone or like insulating oil held at a temperature of approximately 120° C.

A typical example of the frequency constant of the exciter means composed of the piezoelectric ceramic 8, as described above, is 1700 KHz-mm, which is smaller than the frequency constant, 2400 KHz-mm, of the conventional cylindrical metal resonator and the sectional area of the exciter means can be increased by that; consequently, its fabrication is easier than the conventional one. The exciter means 7 thus produced and the resonators 1 are coupled together through the cylindrical coupler 2 by means of spot welding or soldering and then the leads 6 are soldered to the electrodes 9, thus completing the assembling of the electromechanical filter. In an experiment in which an AC signal of 100 to 500 KHz was applied to the electromechanical filter via the leads 6, the exciter means 7 and the resonators 1 vibrated in a longitudinal vibration mode and the coupler 2 vibrated in a bending vibration mode and, in the case of the couplers being short, they vibrated in a shear vibration mode, producing very excellent band-pass filter characteristic as a whole.

Figure 3:
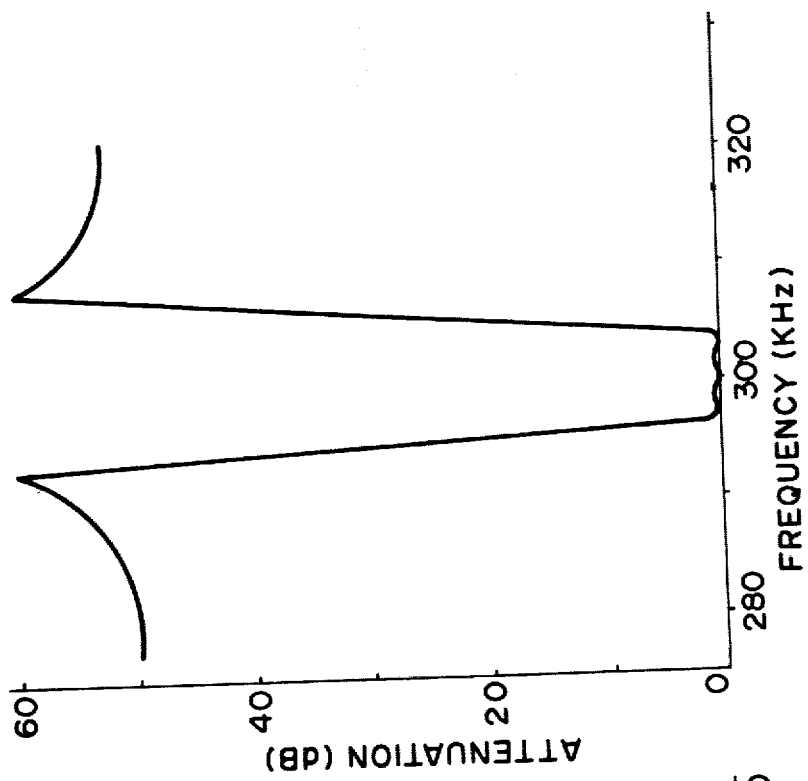
FIGS. 3, 4 and 5 are diagrams showing electrical characteristics of the electromechanical filter depicted in FIG. 2.
Figure 4:
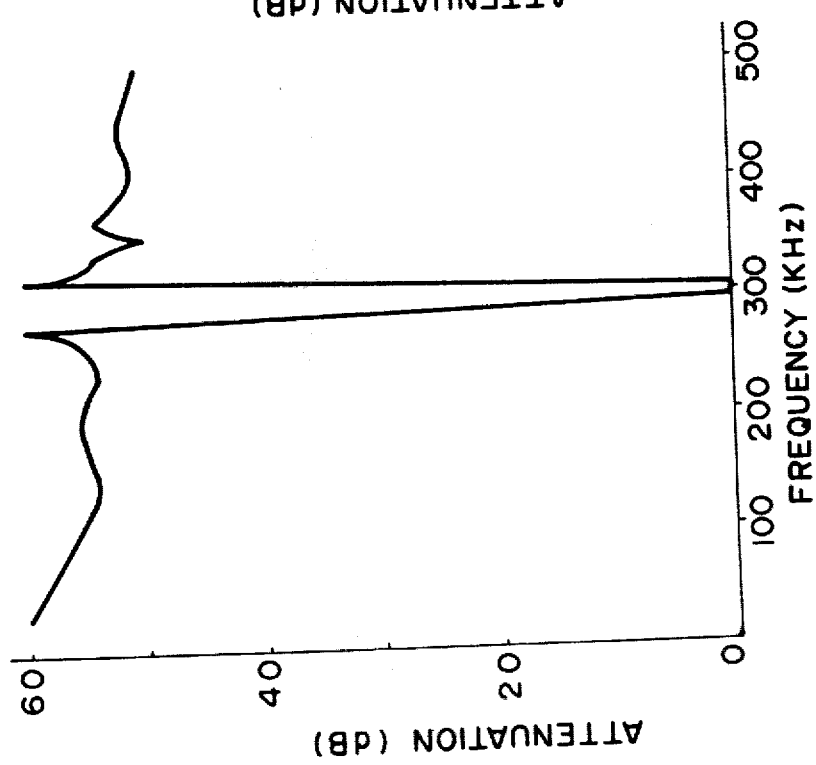

FIGS. 3 and 4 show the results of measurement of the band-pass filter characteristic of the electromechanical filter of FIG. 2 for different frequency sweep ranges. As is evident from FIGS. 3 and 4, the electromechanical filter of the present invention exhibits highly excellent characteristic in which attenuation in the pass band is small, ripples are few and no spurious response is provided.

Figure 5:
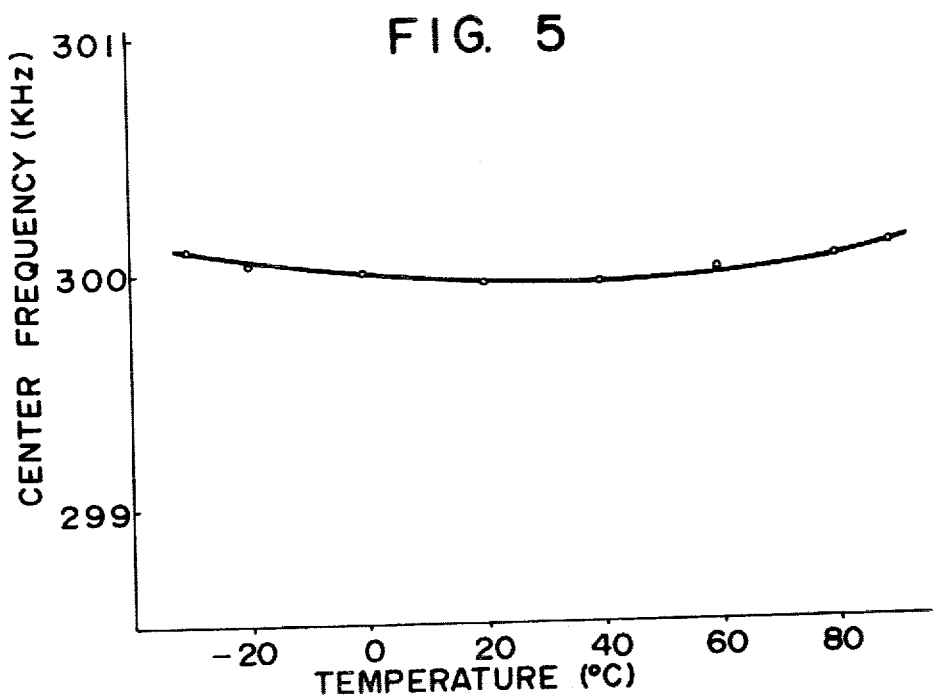

FIG. 5 shows experimental results of the temperature stability of the electromechanical filter depicted in FIG. 2. The center frequency of the pass band of the band-pass filter according to this invention is markedly stable over a very wide temperature range from $-20°$ to 80° C., as shown. Such high temperature stability is unobtainable with the prior art using epoxy resin or like adhesive binder which is poor in temperature stability.

Figure 6:
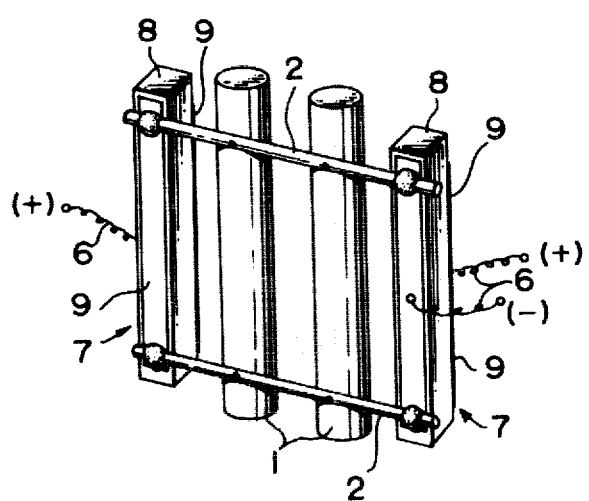
FIG. 6 is a perspective view illustrating another embodiment of this invention having a coupler added to the electromechanical filter of FIG. 2.

FIG. 6 illustrates in perspective another embodiment of this invention, in which the same coupler 2 as that employed in the embodiment of FIG. 2 is attached to the lower end portion of the electromechanical filter shown in FIG. 2. With this structure, the bandwidth of the electromechanical filter increase about 40%, as compared with that obtainable with the structure of FIG. 2, and the mechanical strength also increases.

Figure 7A:
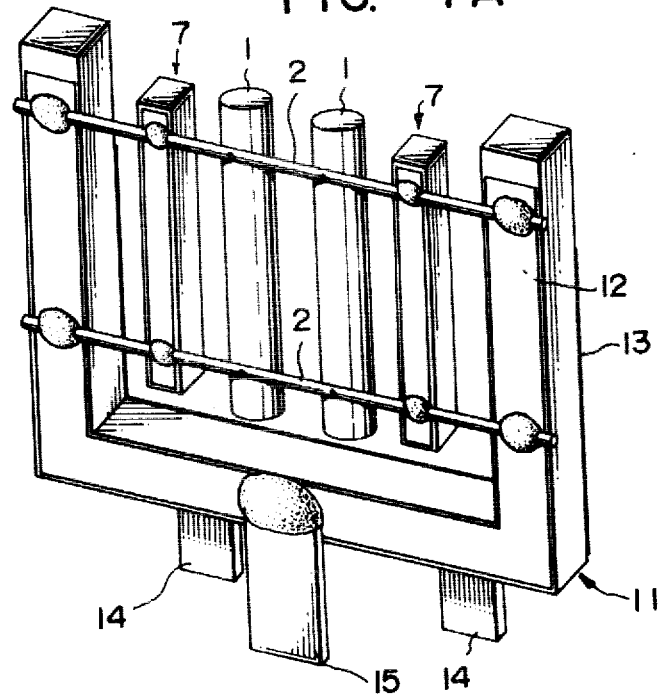
FIGS. 7a and 7b are perspective views showing another embodiment of the electromechanical filter of this invention provided with a supporter.
Figure 7B:
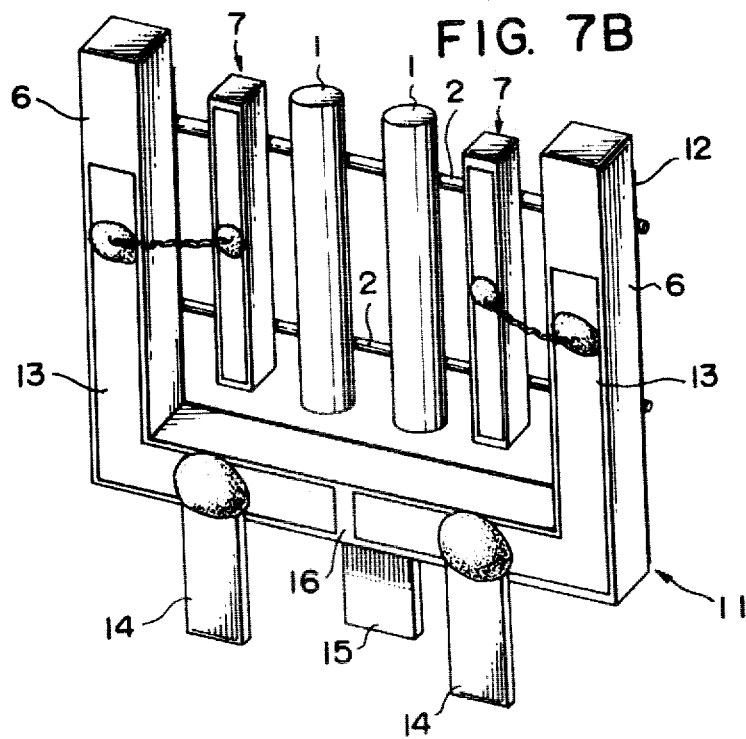

FIGS. 7a and 7b show in perspective the front and back of another embodiment of the electromechanical filter of this invention. In FIGS. 7a and 7b, the upper and lower couplers 2 of the electromechanical filter of FIG. 5 are formed to extend outwardly of the exciters 7 and secured by spot welding or soldering to a surface metal layer 12 of a supporter 11; therefore, this electromechanical filter is identical in construction with that of FIG. 2 except the extended portions of the couplers 2 and the supporter 11. The supporter 11 comprises two vertical arms extending across the couplers 2 substantially at right angles thereto and one horizontal arm mechanically interconnecting the vertical arms. The vertical and horizontal arms are respectively about 10 mm. in length. The support 11 is formed by punching a sheet of epoxy resin containing glass fibers and having a thickness of about 1.0 mm. On one pair of opposing surfaces of each arm, copper foils about 0.03 mm. thick are deposited to extend along the arm, providing conductive parts 12 and 13, which have both the coupler supporting function and the conducting function.

The conductive parts 12 and 13 can be formed by known photoetching techniques.

To the conductive part 13 are secured by soldering or spot welding two electrode terminals 14, while an electrode terminal 15 is similarly secured to the conductive part 12. In FIG. 7b, it must be noted that an air gap 16 is formed in the conductive part 13 centrally thereof. The air gap 16 yields a stray capacitance of an appropriate value between the right and left conductive parts 13. The value of this stray capacitance is suitably selected in accordance with a desired filter characteristic; for example, in the case of the electromechanical filter having the characteristics illustrated in FIGS. 3 and 4, the stray capacitance may be selected to have a value of about 5 PF. The terminal 15 is grounded and one and the other of the two terminals 14 are respectively connected as an input terminal and as an output terminal of the electromechanical filter to an AC signal source (not shown). The power loss in the pass band of the electromechanical filter of such a construction is 1.7 dB, which is larger than the power loss of the electromechanical filter of FIG. 6 by 0.3 dB only. Further, the provision of the air gap 16, enables easy loading of a capacitance of a suitable value.

Although the present invention has been described in connection with some specific operative embodiments, it will be obvious to those skilled in the art that many modifications and variations may be effected without departing from the scope of the noval concepts of this invention, as recited in the appended claims.

What is claimed is:

1. An electromechanical filter comprising:
   exciter means composed of two or more transducers for exciting a mechanical vibration;
   resonator means composed of one or more mechanical resonators for resonating with the exciter means;
   coupler means composed of one or more mechanical couplers for mechanically coupling the exciter means and the resonator means with each other, the mechanical couplers being disposed to extend across the exciter means and the resonator means almost perpendicularly and secured to the both means;
   in which the transducers are each formed with a thin bar-shaped piezoelectric ceramic having a pair of thin surface layers formed onto its opposing surfaces and being polarized by having a voltage placed across the electrodes,
   and wherein both ends of each of the couplers is extended outwardly, and wherein there is provided support means for fixedly supporting the extended both end portions of the coupler on surfaces of two vertical arms extending almost perpendicularly to the coupler, the support means having at least one horizontal arm for interconnecting the two vertical arms and providing both mechanical support and electrical termination.

2. An electromechanical filter according to claim 1, wherein the thin bar-shaped piezoelectric ceramic has a square cross-section.

3. An electromechanical filter according to claim 2, wherein the two vertical arms and the horizontal arm each have a pair of metal electrodes formed on one pair of opposing surfaces of the arm to extend along it, and wherein the both end portions of the couplers are connected to one of the pair of metal electrodes electrically and mechanically.

4. An electromechanical filter according to claim 3, wherein the metal electrode and the horizontal arm has an air gap of a predetermined width for producing a predetermined stray capacitance on the surface of the horizontal arm.

* * * * *